United States Patent [19]

Weimer et al.

[11] Patent Number: 5,759,262
[45] Date of Patent: Jun. 2, 1998

[54] METHOD OF FORMING HEMISPHERICAL GRAINED SILICON

[75] Inventors: Ronald A. Weimer; Randhir P. S. Thakur, both of Boise, Id.; Avishai Kepten; Michael Sendler, both of Migdal Haemek, Israel

[73] Assignee: Micron Technology, Inc., Boise, Id.

[21] Appl. No.: 831,181

[22] Filed: Apr. 2, 1997

Related U.S. Application Data

[63] Continuation of Ser. No. 552,828, Nov. 3, 1995.

[51] Int. Cl.$^6$ .................................................. C30B 31/22
[52] U.S. Cl. ...................... 117/88; 117/8; 438/398; 438/665; 438/964
[58] Field of Search ................ 117/7, 8, 88; 257/308, 257/317; 438/398, 665, 964

[56] References Cited

U.S. PATENT DOCUMENTS

| | | | |
|---|---|---|---|
| 5,278,091 | 1/1994 | Fazan et al. | 437/52 |
| 5,340,763 | 8/1994 | Dennison | 437/52 |
| 5,340,765 | 8/1994 | Dennison et al. | 437/52 |
| 5,407,534 | 4/1995 | Thakur | 156/662 |
| 5,418,180 | 5/1995 | Brown | 437/60 |
| 5,486,488 | 1/1996 | Kamiyama | 437/60 |

OTHER PUBLICATIONS

Hirohito Watanabe et al., "An Advanced Techique for Fabricating Hemispherical-Grained (HSG) Silicon Storage Electrodes", *IEEE Trans Electron Devices*, vol. 42, No. 2, pp. 295–300 (Feb. 1995).

H. Watanabe et al., "Hemispherical Grained Silicon (HSG-Si) Formation of In-Situ Phosphorous Doped Amorphous-Si Using The Seeding Method", *Extended abstracts of the 1992 International Conference on Solid State Devices and Materials*, pp. 422–424 (1992).

*Primary Examiner*—Felisa Garrett
*Attorney, Agent, or Firm*—Trask Britt & Rossa

[57] ABSTRACT

A method of forming HSG is disclosed, in which a layer of starting material is formed on a wafer, the layer of starting material is seeded with a species and the seeded layer is annealed. The seeding and annealing steps can be performed under different conditions and can be varied independently of each other.

26 Claims, 2 Drawing Sheets

METHOD OF FORMING HEMISPHERICAL GRAINED SILICON

This is a continuation of application Ser. No. 08/552,828 filed on Nov. 3, 1995.

TECHNICAL FIELD

The present invention relates to the fabrication of integrated circuit devices and, more particularly, to a method of forming hemispherical grained silicon ("HSG").

BACKGROUND

The continued increase in density of integrated circuits and correlative demand for circuit devices that consume less power has forced the semiconductor industry to consider new manufacturing techniques that enable fabrication of devices on a submicron scale. These trends also have made dynamic random-access memory arrays ("DRAMs") an attractive option for many applications.

In the fabrication of DRAMs, it is essential that the plates of the storage capacitor have sufficient surface area to retain an adequate charge, despite the presence of parasitic effects that permit charge to leak from the plates during circuit operation. Maintenance of adequate storage capacitance is particularly challenging because future generations of DRAMs will require substantially higher device densities.

It is known that storage capacitance can be enhanced without increasing the storage electrode height or the area that the storage capacitor occupies in the cell by using HSG to form the storage node electrode. Electrodes formed with HSG have greater surface area and, therefore, greater capacitance for a given footprint area because HSG has a rough granular surface. Currently known methods for forming HSG include (1) depositing HSG directly on a wafer utilizing a conventional technique, e.g. low pressure chemical vapor deposition; (2) depositing a starting material, e.g. amorphous silicon ("a-Si"), on a wafer and then annealing the starting material layer to form HSG; and (3) depositing a starting material on a wafer, seeding the starting material with a species and then annealing the seeded layer at the same temperature at which seeding took place to form HSG. See U.S. Pat. No. 5,407,534 (U.S. Class 156/662), issued Apr. 18, 1995, to Thakur et. al., and the references cited therein for a further discussion of currently known methods.

These methods, however, are plagued by several drawbacks, including the following: (1) roughness of the HSG is suboptimal, resulting in lower capacitances; (2) starting material is converted into HSG over a very narrow temperature range, requiring precise process temperature controls; (3) process flows are inflexible; (4) both seeding and annealing are performed at substantially identical temperatures in the same process flow so that seeding and annealing conditions are not varied and, therefore, not optimized independently of each other; (5) only silicon hydrides, e.g., disilane ($Si_2H_6$), are used as seeding materials; (7) disilane seeding materials always are used in diluted form, resulting in slower seeding; (8) seeding is time consuming; and (9) seeding is sparse, resulting in smoother HSG. It can be appreciated that many of these drawbacks are interrelated.

SUMMARY OF THE INVENTION

The current invention provides an improved method of forming HSG, which does not suffer from the above-mentioned drawbacks. According to the present invention, a layer of starting material is initially formed on a wafer. Subsequently, the layer of starting material is seeded with a species. Finally, the seeded layer is annealed to form HSG. The seeding and annealing steps can be performed under different conditions and can be varied independently of each other.

The advantages of the present method over conventional methods are numerous and include the following: (1) seeding and annealing conditions can be varied independently of each other in the same process flow so that process parameters can be chosen so as to optimize the roughness of the HSG; (2) the starting material can be converted into HSG over a broader range of temperatures, potentially resulting in an increase in the selectivity of seeding; (3) several alternative process flows are possible, e.g., seeding and annealing can be performed in different reactors or chambers, for added flexibility; (4) undiluted silicon hydrides can be used as seeding materials, resulting in faster seeding; (5) a larger variety of species can be used as seeding materials, e.g., Groups III, IV and V elements and group III-V compounds; (8) it is suspected that faster seeding can be achieved; and (9) it is suspected that denser seeding can be achieved, resulting in rougher HSG.

DESCRIPTION OF THE PREFERRED EMBODIMENT

Figure 1:
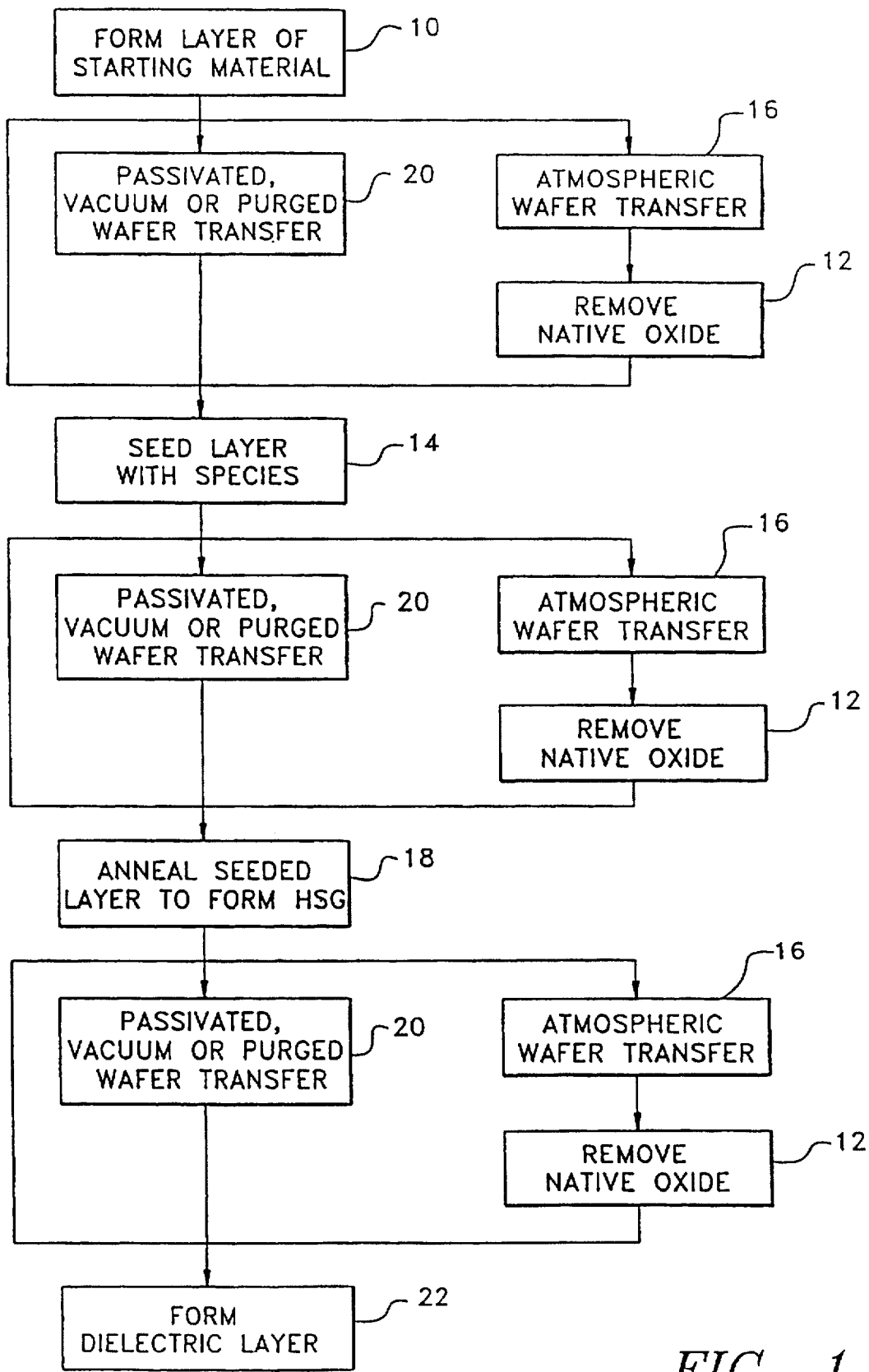
FIG. 1 is a process flow diagram of an embodiment of the present invention.

Referring to FIG. 1, in step 10, a layer of starting material is formed on a wafer. Possible starting materials include doped a-Si, undoped a-Si and porous a-Si. The starting material may be formed using a variety of techniques, including plasma enhanced chemical vapor deposition ("PECVD"), low pressure chemical vapor deposition ("LPCVD") or rapid thermal chemical vapor deposition ("RTCVD"). In a DRAM process flow, the starting material layer can be utilized as the ungrounded, i.e. charged, electrode, which will be capped by a dielectric and is typically of a thickness of at least 50 angstroms.

Figure 2:
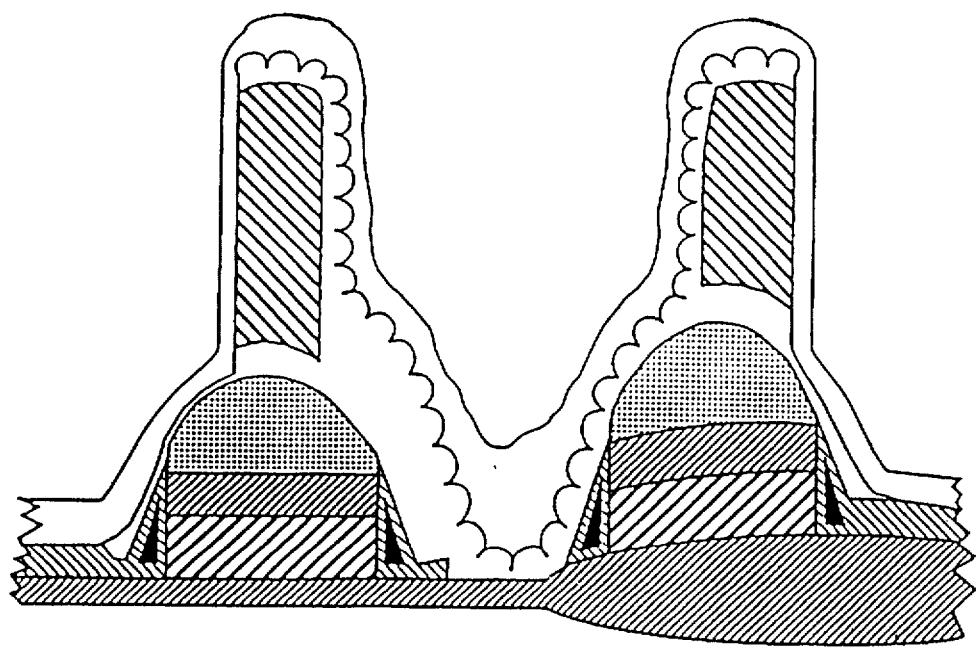
FIG. 2 is an illustration of a capacitor structure formed in a ministack configuration and having a rough cell electrode made of HSG.
Figure 3:
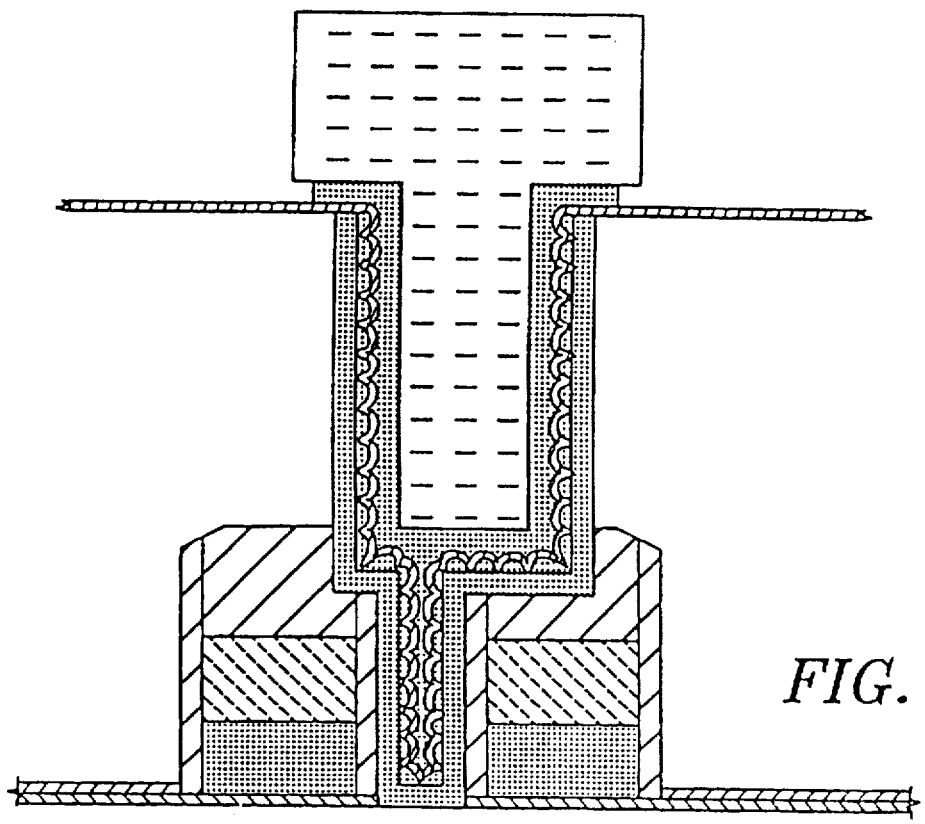
FIG. 3 is an illustration of a capacitor structure formed in a container flow configuration and having a rough cell electrode made of HSG.

The electrode may be part of any type of capacitor structure, including those formed in a ministack configuration, as illustrated in FIG. 2, or a container flow configuration, as illustrated in FIG. 3. Moreover, the capacitor may be on honeycomb, fin or other cell plate structures. Although not shown in FIG. 1, the starting material layer may be patterned into these structures after the layer is formed and before it is subjected to further processing, with no poly-stringers or shorts between capacitors resulting from the further processing described herein.

In step 14, the starting material layer is seeded with a species. The individual seeds act as nucleation centers at which individual HSG grains begin to grow. The layer can be seeded by either (1) irradiating the wafer with the species, whereby the species is deposited as atoms, particles or a thin film on the surface of the layer or (2) doping the layer with the species, whereby the species is interstitially or substitutionally incorporated into the surface layers of the starting material.

In general, the parameters for the irradiation process include (1) pressure in the reaction chamber, (2) temperature in the reaction chamber, (3) seeding time and (4) gas flow rate of the seeding material. The preferred gas flow rate can vary depending upon the specific reactor or chamber type used. The seeding should be performed at a temperature of approximately 100 to 1000 degrees Celsius and a pressure of less than approximately 200 torr with a flow rate of approximately 1 to 500 sccm for a time period of approximately 1 second to 60 minutes.

During irradiation, the seeding material is deposited as a layer, utilizing any known deposition process, including PECVD, PVD, LPCVD and RTCVD. The seeding material layer typically has a thickness of less than approximately 30 angstroms. Preferably, the seeding material is $SiH_2$, $Si_2H_6$, $SiH_2Cl_2$ or any other silicon that contains a hydride. The hydride may be undiluted in the preferred embodiment, which will permit faster seeding. Alternatively, any Group IV and Groups III–V material that is deposited to emulate the structure or effect of a silicon-based species, e.g., carbon in the crystal form of diamond, may be used as a seeding material.

In an alternative embodiment, the seeding is accomplished by doping the starting material layer with a species. Unlike seeding by irradiation, as described above, seeding by doping involves substitutional or interstitial incorporation of the seeding material into the surface layers of the starting material. The dopants change the surface properties of the starting material layer, e.g., the mobility of the atoms, and, thereby, act as nucleation centers for the growth of individual grains of HSG. The layer may be doped in a variety of ways, including ion implantation or vapor phase doping. For the ion implantation method, process parameters include (1) dose of the implant and (2) energy of the implant. For the vapor phase deposition method, process parameters include (1) pressure in the reaction chamber, (2) temperature in the reaction chamber, (3) doping time and (4) gas flow rate of the dopant. Suitable dopants include Group III or Group V elements.

The seeding operation can be performed in situ. Alternatively, steps 10 and 14 can be performed in different reactors or chambers, which will require an intervening wafer transfer. The main obstacle to a wafer transfer is the possible formation of native oxide on the starting material layer during transfer, which can impede the subsequent seeding operation.

This problem is overcome in one of two ways: (1) removing the native oxide after it is formed, or (2) preventing the native oxide from forming in the first place. Where the wafer is transferred to a new reactor or chamber and is exposed to the atmosphere during such transfer, as depicted in step 16, native oxide will necessarily form on the wafer. As depicted in step 12, this native oxide should be removed prior to subsequent processing. The native oxide can be removed through a vapor clean operation, e.g. an HF vapor clean. When using HF, the vapor clean should be performed at a pressure of at least approximately 1 mtorr and a temperature of less than approximately 200° C. Optionally, methanol vapor can be added to the chamber during the vapor clean to act as a catalyst to facilitate control of the cleaning process.

To prevent the native oxide from forming in the first place, an HF dip can be performed to passivate the surface of the wafer, prior to wafer transfer. Alternatively, a vacuum wafer transfer or purged wafer transfer, e.g., an $N_2$ purged transfer, can be used to effect wafer transfer without exposing the wafer to the atmosphere and, therefore, preventing the formation of native oxide. These alternatives are depicted in step 20.

Although not depicted in the process flow of FIG. 1, any process step in the entire flow may be preceded or followed by an operation to remove contaminants remaining from previous process steps. For example, metallic contaminants can be introduced during cleaning steps and organic contaminants can be introduced during photolithographic process steps. These contaminants and others can negatively affect the HSG formation process. Preferably, an ultraviolet-ozone clean is used to remove organic contaminants and an ultraviolet-chlorine clean is used to remove metallic contaminants. However, it should be noted that an ultraviolet-ozone clean may oxidize the surface of the wafer and, therefore, interfere with the seeding and annealing steps. Therefore, the ultraviolet-ozone clean should only be used where this will not pose a problem. Finally, other techniques for removing contaminants are known and may be used here.

In step 18, the seeded layer is annealed to form HSG. In general, the process parameters of the anneal include (1) pressure in the reaction chamber, (2) temperature in the reaction chamber and (3) anneal time. It has been discovered that the process parameters of the anneal can be varied independently of the process parameters of the seeding operation so that the overall process flow for HSG formation can be optimized, as illustrated below in the description of the performed experiments. Preferably, no seeding gases flow during the anneal. The anneal should be carried out at a temperature of approximately 200 to 1500 degrees Celsius and at a pressure of approximately $10^{-8}$ torr to 1 atm for a time period of approximately 1 second to 5 hours. Although not shown in FIG. 1, the starting material layer may be patterned after it is annealed and before it is subjected to further processing, depending upon the application.

Preferably, the seeding step is performed at a temperature of approximately 500 to 700 degrees Celsius with a flow rate of approximately 10 to 100 sccm and the annealing step is performed at a temperature of approximately 500 to 800 degrees Celsius for a time period of approximately 5 to 100 seconds.

The annealing operation can be performed in situ. Alternatively, steps 14 and 18 can be performed in separate reactors or chambers, which will require an intervening wafer transfer. The main obstacle to a wafer transfer is the possible formation of native oxide on the seeded layer during transfer, which can impede the subsequent formation of HSG. This problem can be overcome in the manner already described above.

In a DRAM process flow, the HSG layer created by the process described above can be utilized as an ungrounded, i.e. charged, electrode. In such an embodiment, a layer of dielectric will be formed in a conventional manner above the newly-formed HSG layer, as depicted in step 22.

As was the case for the seeding and annealing operations, the formation of the dielectric layer can be performed in situ. Alternatively, steps 18 and 22 can be performed in separate reactors or chambers, which will require an intervening wafer transfer. The main obstacle to a wafer transfer is the possible formation of native oxide on the layer of HSG, which can impede the subsequent formation of the dielectric layer as well as degrade the electrical characteristics of the finished capacitor. This problem can be overcome in the manner already described above.

Experiments were performed in connection with the present invention. The experiments were carried out on an "INTEGRA THREE™" fully-automated single wafer cluster tool, manufactured by AG Associates. In these experiments, a-Si was used as the starting material. Experiments were performed for both undoped and doped a-Si. The conversion of a-Si to HSG and the quality of the HSG so formed was detected by UV-1050 reflectance measurements and scanning electron microscope ("SEM") micrographs.

Initially, HSG was formed using the known method of high vacuum anneal of undoped a-Si, 520° C., 5% $Si_2H_6$ in Ar. Anneals were performed at 50° C. intervals in the temperature range of 600° C. to 850° C., inclusive, at $5\times10^{-7}$ torr for 5 minutes. While the anneal at 700° C. did not convert the a-Si to HSG, the anneal at 750° C. did. The anneal at 800° C. resulted in polysilicon ("poly-Si") formation. An anneal temperature of 710° C. was found to be sufficient to convert a-Si into HSG with an anneal time of less than 4 minutes.

Finally, HSG was formed using an embodiment of the present invention, which included a seeding step in conjunction with an annealing step. Using undoped a-Si, the following results were obtained. Application of 5 sccm (standard cubic centimeters per minute) of pure $Si_2H_6$, as a seeding material, for 5 seconds at 710° C. followed by a 45 second anneal at 710° C. was found to convert the a-Si into poly-Si, with no formation of HSG. Seeding at 660° C. for 10 seconds with 10 sccm of pure $Si_2H_6$ followed by a 90 second anneal at 670° C. was sufficient to convert the a-Si into HSG. Increasing the temperature of the anneal decreased the anneal time, but did not appear to affect the seeding conditions. The temperature of the anneal was, therefore, increased to 685° C. for a more rapid conversion to HSG.

As the seeding temperature was decreased, the intensity of the seeding required for conversion to HSG increased, i.e. higher flows for longer times. This relationship is most likely due to the decreased growth-rate of the seeding material with decreased temperature.

Using UV-1050 reflectance, seed and anneal conditions for optimally rough HSG were found to be approximately 40 sccm for approximately 30 seconds at approximately 655° C. and approximately $10^{-4}$ torr followed by an approximately 40 to 60 second anneal at approximately 685° C. and approximately $5\times10^{-7}$ torr.

For this initial sample of a-Si, non-uniformities in grain structure were observed between the conversion of HSG in the center of the wafer as compared to the edge. This phenomenon can be attributed to the non-uniformity of the thickness of the a-Si layer between the center of the wafer and the edge. Where a more uniform layer of a-Si, having a thickness of 800 angstroms with a 1% deviation over 3 sigma, was used in lieu of the initial sample of a-Si, uniform conversion of HSG across the entire wafer was observed. Accordingly, it is preferable to use a layer of starting material that has a substantially uniform thickness over the entire area, or at least over a significant area, of the wafer.

Using doped a-Si, $2\times10^{20}$ $m^{-3}$, as the starting material, lower annealing temperatures and heavier seeding conditions were generally required to convert the a-Si into HSG. Seed and anneal conditions for optimally rough HSG were found to be approximately 60 sccm for approximately 50 seconds at approximately 645° C. and approximately $10^{-4}$ torr followed by an approximately 90 second anneal at approximately 650° C. and approximately $5\times10^{-7}$ torr.

Because the doped a-Si more readily converted to poly-Si than did the undoped a-Si, more precise control over the anneal time and temperature was required to avoid conversion of the a-Si into poly-Si instead of HSG.

Further, heavier seeding conditions, i.e. higher flow rates for longer times, were required because of the lower seeding temperature and the need to prime the surface of the a-Si to convert it to HSG so as to avoid conversion of the a-Si into poly-Si. This was not a problem when undoped a-Si was used, for the anneal temperatures and times utilized in these experiments. Again, nonuniform thickness of the doped a-Si layer resulted in areas of the wafer where no conversion occurred and areas where, due to the doping, poly-Si, instead of HSG, conversion occurred.

The current invention achieved a two-fold increase in capacitance over that which can be achieved utilizing planar polysilicon technologies.

Each U.S. Patent referenced herein is hereby incorporated by reference thereto as if set forth in its entirety. Although we have illustrated and described a present preferred embodiment of the invention and variations thereon, the invention is not limited thereto but may be embodied otherwise within the scope of the following claims.

We claim:

1. A method of forming HSG, comprising the following steps:

forming a layer of starting material on a wafer;

seeding the layer of starting material with a species, the seeding step being performed under a first value for a process parameter; and annealing the seeded layer, the annealing step being performed under a second value for the process parameter, wherein the first and second values differ.

2. The method of claim 1 wherein the seeding step is performed under a first range of values for the process parameter and the annealing step is performed under a second range values for the process parameter, wherein the first and second ranges differ.

3. The method of claim 1 wherein the layer of starting material has a substantially uniform thickness over a significant area of the wafer.

4. The method of claim 1 wherein the starting material is deposited using a method selected from the group consisting of plasma enhanced chemical vapor deposition, low pressure chemical vapor deposition and rapid thermal chemical vapor deposition.

5. The method of claim 1 wherein the layer of starting material comprises amorphous silicon.

6. The method of claim 5 wherein the layer of starting material comprises doped amorphous silicon.

7. The method of claim 1 wherein the seeding step is performed in a first chamber, the layer of starting material is formed in a second chamber and the first and second chambers are different chambers.

8. The method of claim 1 wherein the seeding step comprises irradiating the layer of starting material with the species.

9. The method of claim 8 wherein the seeding step is performed at a temperature of approximately 100 to 1000 degrees Celsius.

10. The method of claim 8 wherein the seeding step is performed at a pressure of less than approximately 200 torr.

11. The method of claim 8 wherein the seeding step is performed at a flow rate of approximately 1 to 500 sccm.

12. The method of claim 8 wherein the seeding step is performed for a time period of approximately 1 second to 60 minutes.

13. The method of claim 8 wherein the species is selected from the group consisting of $SiH_2$, $Si_2H_6$, $SiH_2Cl_2$ and all other silicon hydrides.

14. The method of claim 8 wherein the species is an undiluted hydride.

15. The method of claim 8 wherein the species is selected from the group consisting of Group IV elements and Group III-V compounds.

16. The method of claim 8 wherein the seeding step is performed at a temperature of approximately 500 to 700 degrees Celsius with a flow rate of approximately 10 to 100 sccm and the annealing step is performed at a temperature of approximately 500 to 800 degrees Celsius for a time period of approximately 5 to 100 seconds.

17. The method of claim 1 wherein the seeding step comprises doping the layer of starting material with the species.

18. The method of claim 17 wherein the doping comprises ion implantation.

19. The method of claim 17 wherein the doping comprises vapor phase doping.

20. The method of claim 17 wherein the dopant is selected from the group consisting of Group III and Group V elements.

21. The method of claim 1 wherein the annealing step is performed at a temperature of approximately 200 to 1500 degrees Celsius.

22. The method of claim 1 wherein the annealing step is performed at a pressure of less than approximately 1 atm.

23. The method of claim 1 wherein the annealing step is performed for a time period of approximately 1 second to 5 hours.

24. The method of claim 1 wherein the annealing step is performed in a first chamber, the seeding step is performed in a second chamber and the first and second chambers are different chambers.

25. The method of claim 1, further comprising the step of forming a layer of dielectric above the annealed layer.

26. The method of claim 25 wherein the dielectric layer is formed in a first chamber, the annealing step is performed in a second chamber and the first and second chambers are different chambers.

* * * * *